United States Patent
Liu et al.

(10) Patent No.: US 9,741,572 B1
(45) Date of Patent: Aug. 22, 2017

(54) METHOD OF FORMING OXIDE LAYER

(71) Applicant: UNITED MICROELECTRONICS CORP., Hsin-Chu (TW)

(72) Inventors: Chueh-Yang Liu, Tainan (TW); Chun-Wei Yu, Tainan (TW); Yu-Ying Lin, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 13 days.

(21) Appl. No.: 15/049,152

(22) Filed: Feb. 22, 2016

(51) Int. Cl.
*H01L 21/8234* (2006.01)
*H01L 21/28* (2006.01)
*H01L 29/66* (2006.01)

(52) U.S. Cl.
CPC ......... *H01L 21/28185* (2013.01); *H01L 21/823462* (2013.01); *H01L 29/66545* (2013.01)

(58) Field of Classification Search
CPC .............................. H01L 31/022425
See application file for complete search history.

(56) References Cited

U.S. PATENT DOCUMENTS

| | | | |
|---|---|---|---|
| 6,689,675 B1 | 2/2004 | Parker | |
| 6,713,358 B1 * | 3/2004 | Chau | H01L 21/28167 257/E21.193 |
| 6,774,047 B2 * | 8/2004 | Funabashi | H01L 21/02063 134/1.3 |
| 2004/0007146 A1 * | 1/2004 | Gutfleisch | B41C 1/1041 101/401.1 |
| 2010/0227461 A1 * | 9/2010 | Ochi | H01L 21/02057 438/586 |
| 2013/0130512 A1 * | 5/2013 | Kato | H01L 21/02274 438/765 |
| 2014/0187006 A1 * | 7/2014 | He | H01L 21/82346 438/275 |

OTHER PUBLICATIONS

Effect of Hydrofluoric Acid in Oxidizing Acid Mixtures on the Hydroxylation of Silicon Surface; Sanjukta Guhathakurta University of Nebraska—Lincoln; Sep. 24, 2007.*
Shih, Title of Invention: Gate Oxide Formation process, U.S. Appl. No. 14/571,249, filed Dec. 15, 2014.

* cited by examiner

*Primary Examiner* — Zandra Smith
*Assistant Examiner* — Andre' C Stevenson
(74) *Attorney, Agent, or Firm* — Winston Hsu

(57) ABSTRACT

A method of forming an oxide layer is provided in the present invention. The method includes the following steps. A first oxide layer is formed on a semiconductor substrate, and a quality enhancement process is then performed to etch the first oxide layer and densify the first oxide layer at the same time for forming a second oxide layer. The first oxide layer is etched and densified at the same time by a mixture of dilute hydrofluoric acid (DHF) and hydrogen peroxide ($H_2O_2$) in the quality enhancement process. The thickness of the second oxide layer may be reduced and the quality of the second oxide layer may be enhanced by the quality enhancement process at the same time.

12 Claims, 4 Drawing Sheets

METHOD OF FORMING OXIDE LAYER

BACKGROUND OF THE INVENTION

1. Field of the Invention

The present invention relates to a method of forming an oxide layer, and more particularly, to a method including a quality enhancement process to etch the oxide layer and densify the oxide layer at the same time for reducing the thickness of the oxide film and enhancing the quality of the oxide film at the same time.

2. Description of the Prior Art

In the continuously improved semiconductor integrated circuit technology, the sizes of the semiconductor devices become smaller for increasing the integrity of the integrated circuit. In the scaling down process, the thickness control of layers in the semiconductor device becomes more and more critical. For improving the metal-oxide-semiconductor field effect transistor (MOSFET) device performance as feature sizes continue to decrease, the traditional gate oxide and polysilicon gate electrode are replaced by a high dielectric constant (high-k) gate dielectric and a metal gate electrode. In high-k gate stacks, the interfacial layer (IL) underlying the high-k dielectric layer plays a critical role in the performance of the. However, the thickness and the quality of the IL may be influenced by subsequent thermal processes, and the performance of the MOSFET device will be affected accordingly.

In an integrated circuit, different circuit modules and/or transistors and other devices in the same chip may operate indifferent voltage regimes. In an integrated switching-mode power supply, which may include a power transistor and a control circuit for switching the power transistor ON and OFF to convert a supply voltage into a desired output voltage, the power transistor may have an operating voltage much higher than an operating voltage of transistors constituting the control circuit. In order to have an area-efficient high voltage device with low voltage control devices fabricated on a same die, gate insulation layers with different thicknesses are required. When the high-voltage driving elements and the low-voltage driving elements are embodied simultaneously, a thick gate oxide film for high voltage and a thin gate oxide film for low voltage are required.

SUMMARY OF THE INVENTION

It is one of the objectives of the present invention to provide a method of forming an oxide layer. In the method of forming the oxide layer of the present invention, a quality enhancement process using a mixture of dilute hydrofluoric acid (DHF) and hydrogen peroxide ($H_2O_2$) is performed to etch the oxide layer and densify the oxide layer at the same time. The thickness of the oxide layer may be reduced and well controlled, and the quality of the oxide layer may be enhanced by the quality enhancement process without damaging a surface of a semiconductor substrate.

A method of forming an oxide layer is provided in an embodiment of the present invention. The method includes the following steps. A first oxide layer is formed on a semiconductor substrate, and a quality enhancement process is then performed to etch the first oxide layer and densify the first oxide layer at the same time for forming a second oxide layer. The first oxide layer is etched and densified at the same time by a mixture of dilute hydrofluoric acid (DHF) and hydrogen peroxide ($H_2O_2$) in the quality enhancement process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating the method of forming the oxide layer according to the embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

Figure 1:
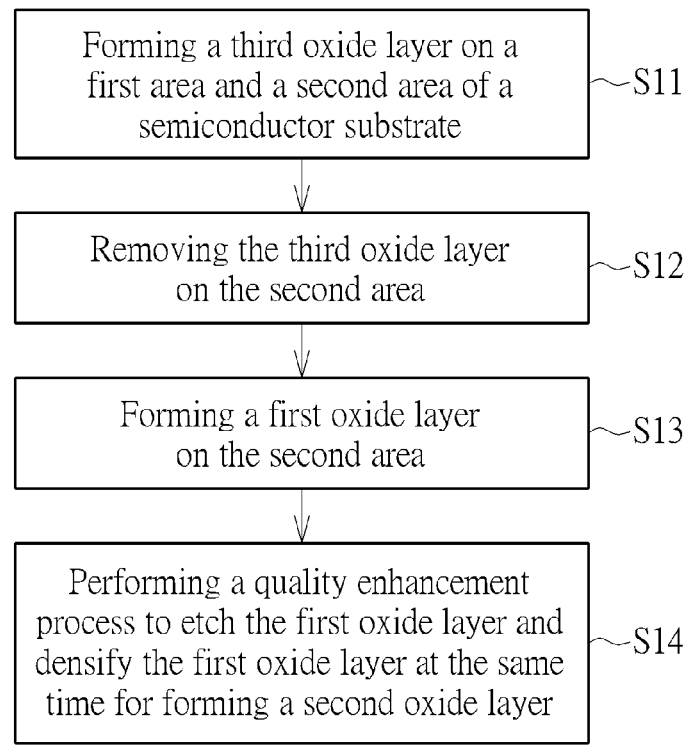
FIG. 1 is a flow chart illustrating a method of forming an oxide layer according to a first embodiment of the present invention.
Figure 2:
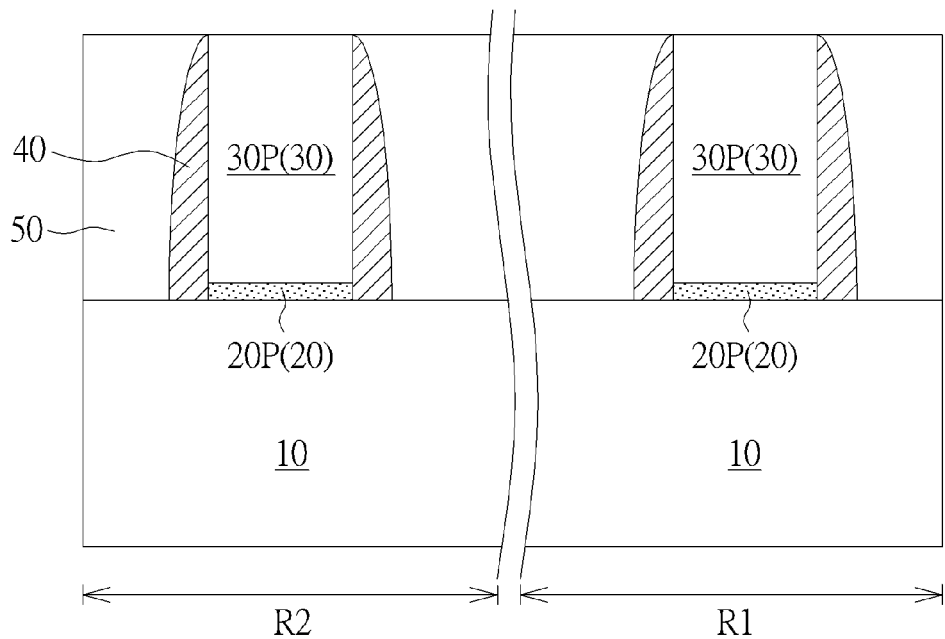

Please refer to FIGS. 1-6. FIG. 1 is a flowchart illustrating a method of forming an oxide layer according to a first embodiment of the present invention. FIGS. 2-6 are schematic drawings illustrating the method of forming the oxide layer in this embodiment. The method of forming the oxide layer in this embodiment includes the following steps. As shown in FIG. 1 and FIG. 2, a semiconductor substrate 10 is provided. The semiconductor substrate 10 may include a silicon substrate, an epitaxial silicon substrate, a silicon germanium substrate, a silicon carbide substrate, or a silicon-on-insulator (SOI) substrate, but not limited thereto. The semiconductor substrate 10 may include a plurality of fin structures (not shown) and a shallow trench isolation (STI, not shown) may be formed between the fin structures, but not limited thereto. In this embodiment, the semiconductor substrate 10 may include a first area R1 and a second area R2 separated from each other by the STI. The first area R1 may be an area requiring a relatively thicker oxide layer, and the second area R2 may be an area requiring a relatively thinner oxide layer. For example, the first area R1 may be an input/output area and the second area R2 may be a logic area, but the present invention is not limited to this. In step S11, a third oxide layer 20 is formed on the semiconductor substrate 10. Specifically, the third oxide layer 20 is formed on the first area R1 and the second area R2 of the semiconductor substrate 10. The third oxide layer 20 may be formed by a thermal oxidation process. Preferably, the third gate oxide layer 20 may be formed by an in-situ steam generation (ISSG) process, which may utilize imported hydrogen gas and oxygen gas, but this is not limited thereto.

In the method of this embodiment, for a replacement metal gate (RMG) process, a dummy material layer 30, such as an amorphous silicon layer, may be formed on the third oxide layer 20, and the dummy material layer 30 and the third oxide layer 20 may be patterned to form a plurality of dummy gates 30P and a patterned third oxide layer 20P. The patterned third oxide layer 20P is disposed between each of the dummy gates 30P and the semiconductor substrate 10, and the dummy gates 30P may be formed on the first area R1 and the second area R2 of the semiconductor substrate 10. Sidewall spacers 40 may be formed on the side walls of the dummy gates 30P and the patterned third oxide layer 20P. An interlayer dielectric 50 may be formed to cover the dummy gates 30P and the semiconductor substrate 10, and a chemical mechanical polish (CMP) process may then be performed to expose the dummy gate 30P.

Figure 3:
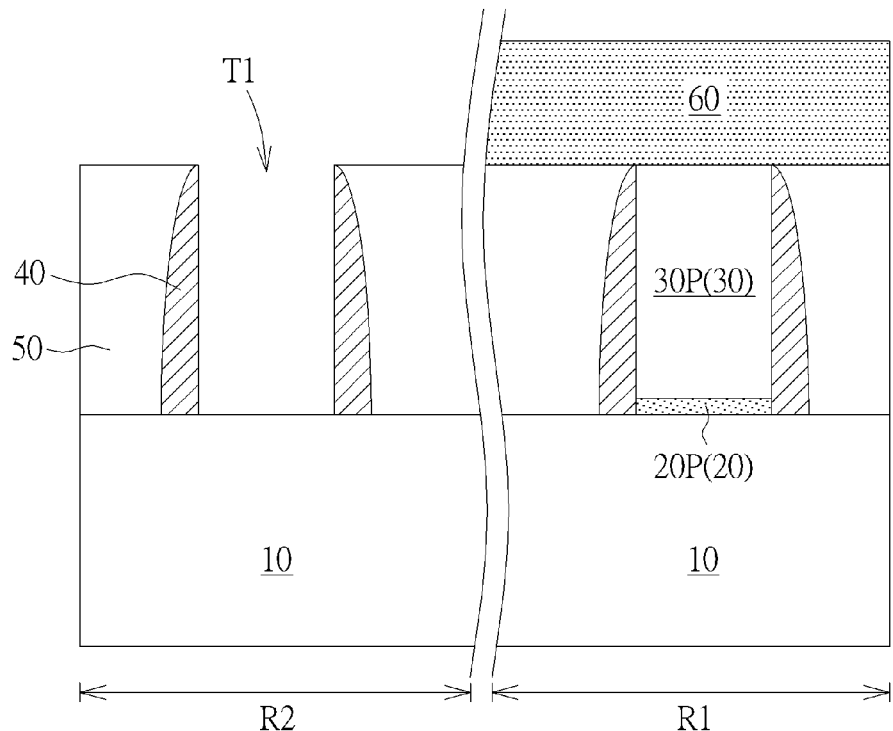

As shown in FIG. 3, a patterned resist 60 may be formed to cover the dummy gate 30P on the first area R1, and the dummy gate 30P on the second area R2 may be removed by an etching process. As shown in FIG. 1 and FIG. 3, in step S12, the third oxide layer 20 on the second area R2 is then removed. In this embodiment, the third oxide layer 20 on the second area R2 may be removed by dilute hydrofluoric acid (DHF). Specifically, a wet etching process using an etchant of DHF may be performed to remove the third oxide layer 20 on the second area R2, but not limited thereto. In other embodiment of the present invention, the third oxide layer 20 on the second area R2 may also be removed by other processes and/or other chemicals. Accordingly, a first trench T1 may then be formed on the second area R2 and expose a part of the semiconductor substrate 10.

Figure 4:
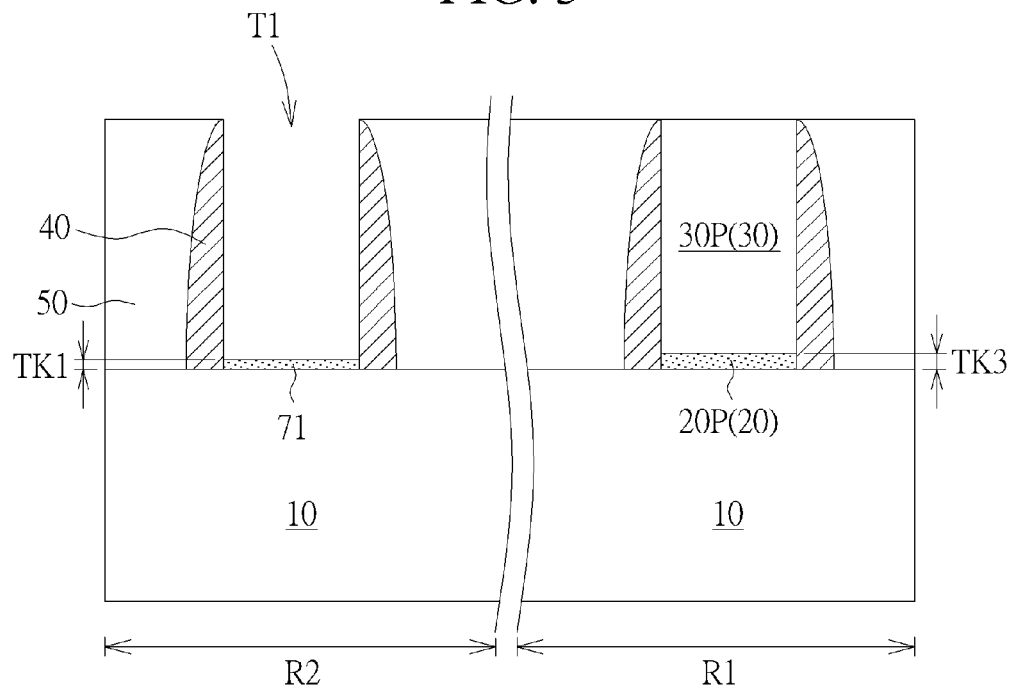

As shown in FIG. 1 and FIG. 4, in step S13, a first oxide layer 71 is formed on the second area R2 of the semiconductor substrate 10. In other words, the third oxide layer 20 is formed on the first area R1 and the second area R2 of the semiconductor substrate 10 before the step of forming the first oxide layer 20, and the third oxide layer 20 on the second area R2 is removed before the step of forming the first oxide layer 71. Specifically, the first oxide layer 71 may include a chemical silicon oxide layer formed by a sulfuric acid peroxide mixture (SPM) treatment, and the first oxide layer 71 is formed on the semiconductor substrate 10 exposed by the first trench T1 on the second area R2. However, in other embodiments of the present invention, the first oxide layer 71 may also be formed by other appropriate processes and/or chemicals. In addition, the patterned resist covering the first area R1 may be removed by the SPM treatment also, but not limited thereto. The treatment time of the SPM treatment may range between 40 seconds and 120 seconds, and the treatment time may be about 60 seconds for example, but not limited thereto. A thickness of the first oxide layer 71 (such as a first thickness TK1 shown in FIG. 4) is less than a thickness of the third oxide layer 20 (such as a third thickness TK3 shown in FIG. 4) preferably, but not limited thereto.

Figure 5:
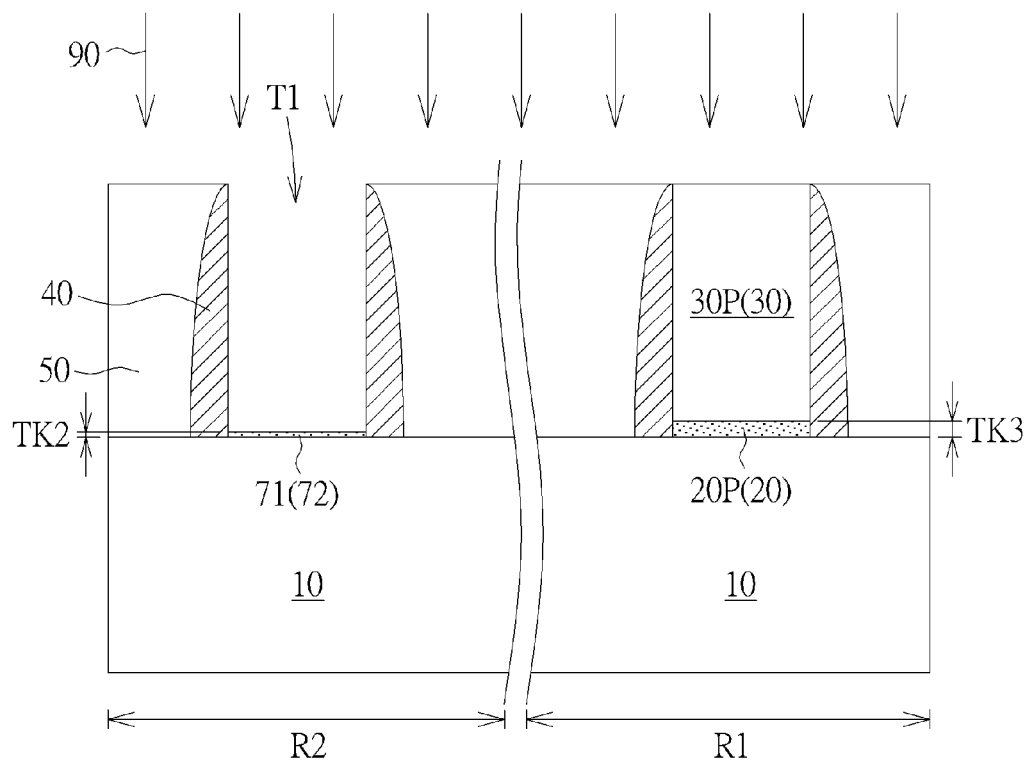

As shown in FIG. 1, FIG. 4, and FIG. 5, in step S14, a quality enhancement process 90 is then performed to etch the first oxide layer 71 and densify the first oxide layer 71 at the same time for forming a second oxide layer 72. The first oxide layer 71 is etched and densified at the same time by a mixture of dilute hydrofluoric acid (DHF) and hydrogen peroxide ($H_2O_2$) in the quality enhancement process 90. The DHF in the mixture is configured to etch the first oxide layer 71, and the hydrogen peroxide in the mixture is configured to oxidize the etched first oxide layer 71 and form the second oxide layer 72 with better quality. In addition, a thickness of the second oxide layer 72 (such as a second thickness shown in FIG. 5) is less than the first thickness TK1 of the first oxide layer 71 preferably so as to form the thinner second oxide layer 72. For example, when the first thickness TK1 of the first oxide layer 71 is about 5.74 angstroms, the second thickness of the second oxide layer 72 after the quality enhancement process 90 may be about 5.14 angstroms. Accordingly, the second thickness TK2 of the second oxide layer 72 is less than the third thickness TK3 of the third oxide layer 20. The thickness of the second oxide layer 72 may be well controlled by the process time of the quality enhancement process 90 and/or the ratio of DHF in the mixture used in the quality enhancement process 90. For example, in the mixture of DHF and hydrogen peroxide, a ratio between hydrofluoric acid and hydrogen peroxide may range between 1:30 and 1:60, but not limited thereto. Additionally, a ratio of hydrofluoric acid, hydrogen peroxide, and water in the mixture may range between 1:30:465 and 1:60:435. In other words, the etching rate of the mixture of DHF and hydrogen peroxide may be controlled to be relatively low for controlling the second thickness TK2 of the second oxide layer more precisely and uniformly. In addition, the quality enhancement process 90 may be performed at room temperature, but not limited thereto. The relatively loose structure in the first oxide layer 71 (such as SiOx) tends to be removed by DHF in the mixture used in the quality enhancement process 90, and the regrowth part of the second oxide layer 72 may contain more relatively dense structure (such as silicon dioxide). Therefore, a silicon dioxide ($SiO_2$) concentration of the second oxide layer 72 may be higher than a silicon dioxide concentration of the first oxide layer 20 because of the densify performance of the quality enhancement process 90. The quench time (Q-time) of the second oxide layer 72 may be increased without thickness increase because the second oxide layer 72 is densified by the quality enhancement process 90. Additionally, chemical oxide with hydrogen-termination may be removed by DHF in the quality enhancement process 90, and the surface of the second oxide layer 72 may be hydrophilic accordingly. The semiconductor substrate 10 will not be damaged by the quality enhancement process 90 because there is no ammonium hydroxide ($NH_4OH$) used in the quality enhancement process 90.

Figure 6:
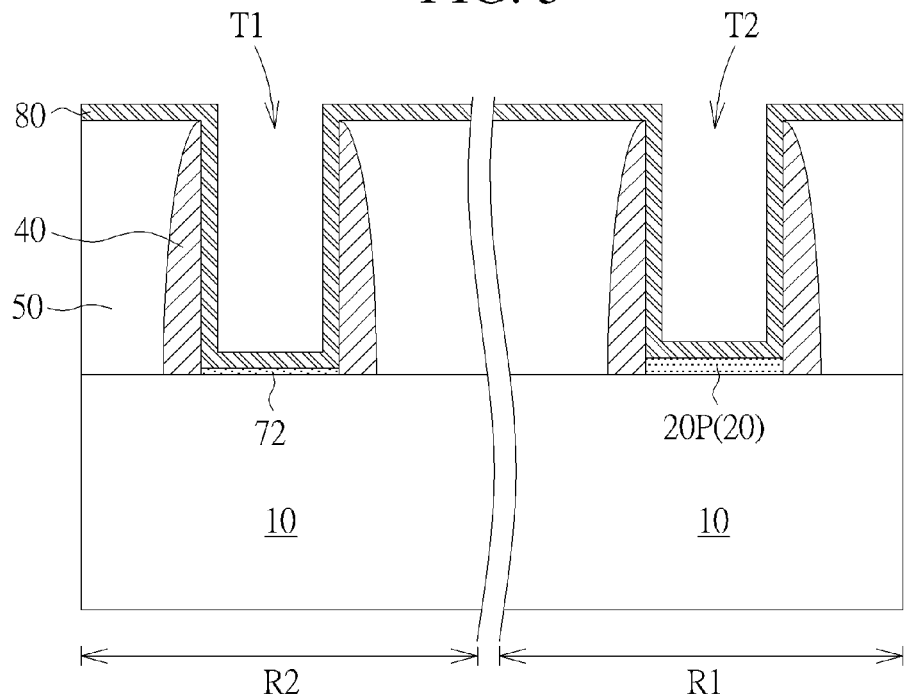

As shown in FIG. 5 and FIG. 6, the dummy gate 30P on the first area R1 may be removed for forming a second trench T2 on the first area R1 and exposing the third oxide layer 20 on the first area R1. A high dielectric constant (high-k) dielectric layer 80 may then be formed on the second oxide layer 72. Specifically, the high-k dielectric layer 80 may be formed conformally on the interlayer dielectric 50, the inner surface of the first trench T1, the inner surface of the second trench T2, the third oxide layer 20, and the second oxide layer 72. The high-k dielectric layer 80 may include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). A barrier layer (not shown), a work function layer (not shown), and a metal conductive material (not shown) may be formed in the first trench T1 and the second trench T2 so as to form metal gate structures on the first area R1 and the second area R2 respectively. Therefore, the second oxide layer 72 may be an interfacial layer of a transistor subsequently formed on the second area R2, and the third oxide layer 20 may be an interfacial layer of a transistor subsequently formed on the first area R1. By the method of the present embodiment described above, the relatively thicker third oxide layer 20 may be formed for the high voltage device on the input/output area, and the relatively thinner second oxide layer 72 may be formed for the low voltage device on the logic area. The film quality of the second oxide layer 72 may be enhanced by the quality enhancement process using the mixture of DHF and hydrogen peroxide, and electrically performance of the semiconductor device including the second oxide layer 72 may be improved accordingly.

It is worth noting that the method of forming the oxide layer in the present invention is not limited to form the interfacial layer of a metal oxide semiconductor (MOS) transistor as the embodiment described above. In other embodiments of the present invention, the method of forming the oxide layer may also be used to form a high quality and extremely thin oxide layer for other devices, such as an oxide layer of a charge trapping structure in a memory device, but not limited thereto.

Figure 7:
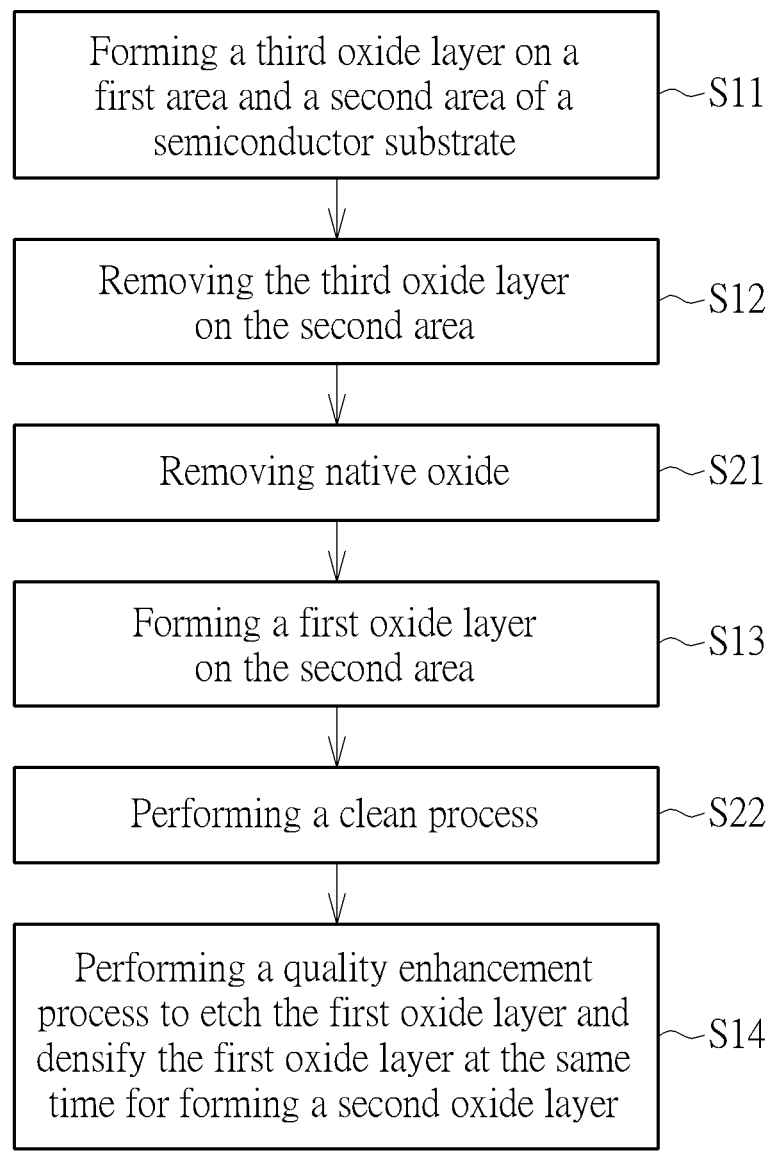
FIG. 7 is a flowchart illustrating a method of forming an oxide layer according to a second embodiment of the present invention.

Please refer to FIG. 7. FIG. 7 is a flow chart illustrating a method of forming an oxide layer according to a second embodiment of the present invention. As shown in FIG. 7, the difference between the method in this embodiment and the method in the first embodiment is that step S21 may be executed after the step S12 and before the step S13, and step S22 may be executed after the step S13 and before the step S14. Specifically, in the step S21, another DHF treatment for about 10 seconds may be performed to remove native oxide before forming the first oxide layer. In the step S22, a clean process may be performed to remove particles after the SPM treatment described above and before the quality enhancement process in the step S14. The clean process may include a standard clean 1 (SC1) clean process or other appropriate clean processes.

To summarize the above descriptions, according to the method of forming the oxide layer in the present invention, the quality enhancement process using the mixture of dilute hydrofluoric acid (DHF) and hydrogen peroxide ($H_2O_2$) is performed to etch the oxide layer and densify the oxide layer at the same time. The thickness of the oxide layer may be reduced and well controlled, and the quality of the oxide layer may be enhanced by the quality enhancement process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an oxide layer comprising:
   forming a first oxide layer on a semiconductor substrate, wherein the semiconductor substrate comprises a first area and a second area;
   performing a quality enhancement process to etch the first oxide layer and densify the first oxide layer at the same time for forming a second oxide layer, wherein the first oxide layer is etched and densified at the same time by a mixture of dilute hydrofluoric acid (DHF) and hydrogen peroxide ($H_2O_2$) in the quality enhancement process, wherein the DHF in the mixture is configured to etch the first oxide layer, the hydrogen peroxide in the mixture is configured to oxidize the etched first oxide layer for densifying the first oxide layer, and the second oxide layer comprises the oxidized first oxide layer;
   forming a third oxide layer on the first area and the second area of the semiconductor substrate before the step of forming the first oxide layer; and
   removing the third oxide layer on the second area before the step of forming the first oxide layer, wherein the first oxide layer is formed on the second area of the semiconductor substrate.

2. The method of claim 1, wherein a ratio between hydrofluoric acid and hydrogen peroxide in the mixture ranges between 1:30 and 1:60.

3. The method of claim 1, wherein the quality enhancement process is performed at room temperature.

4. The method of claim 1, wherein the third oxide layer on the second area is removed by dilute hydrofluoric acid.

5. The method of claim 1, wherein the third oxide layer is formed by a thermal oxidation process.

6. The method of claim 5, wherein the thermal oxidation process comprises an in-situ steam generation (ISSG) process.

7. The method of claim 1, wherein the first area is an input/output area and the second area is a logic area.

8. The method of claim 1, wherein a thickness of the second oxide layer is less than a thickness of the third oxide layer.

9. The method of claim 1, wherein the first oxide layer comprises a chemical silicon oxide layer formed by a sulfuric acid peroxide mixture (SPM) treatment.

10. The method of claim 9, further comprising:
    performing a clean process to remove particles after the SPM treatment and before the quality enhancement process.

11. The method of claim 10, wherein the clean process comprises a standard clean 1 (SC1) clean process.

12. The method of claim 1, further comprising:
    forming a high dielectric constant (high-k) dielectric layer on the second oxide layer.

* * * * *